United States Patent [19]

Pennington et al.

[11] Patent Number: 5,550,974
[45] Date of Patent: Aug. 27, 1996

[54] TESTABLE MEMORY ARRAY WHICH IS IMMUNE TO MULTIPLE WORDLINE ASSERTIONS DURING SCAN TESTING

[75] Inventors: Artie Pennington, Dripping Sprgs., Tex.; Makoto Ueda, Kyoto, Japan

[73] Assignee: Motorola, Inc., Schaumburg, Ill.

[21] Appl. No.: 228,544

[22] Filed: Apr. 15, 1994

[51] Int. Cl.$^6$ .................................................. G01R 31/28
[52] U.S. Cl. ........................................................ 395/183.18
[58] Field of Search ................................. 371/21.1, 22.2, 371/22.3, 22.5, 22.6; 395/183.01, 183.03, 183.06, 183.18

[56] References Cited

U.S. PATENT DOCUMENTS

| | | | |
|---|---|---|---|
| 4,631,660 | 12/1986 | Woffindent et al. | 395/700 |
| 4,680,760 | 7/1987 | Giles et al. | 371/21 |
| 4,760,971 | 4/1988 | Tomm et al. | 371/10.1 |
| 4,982,360 | 1/1991 | Johnson et al. | 371/10.1 |
| 5,107,501 | 4/1992 | Zorian | 371/21.3 |
| 5,263,140 | 11/1993 | Riordan | 395/400 |
| 5,276,833 | 1/1994 | Auvinen et al. | 395/425 |

FOREIGN PATENT DOCUMENTS 0451985  10/1991  European Pat. Off. .

OTHER PUBLICATIONS

"Testability Features of the SuperSPARC Microprocessor," Patel et al; 1993 IEEE, International Test Conference.

"VLSI Chip Set for a Multiprocessor Workstation—Part I: An RISC Microprocessor with Coprocessor Interface and Support for Symbolic Processing," Lee, et al; IEEE Journal of Solid–State Circuits; Dec. 1989.

*Primary Examiner*—Hoa T. Nguyen
*Attorney, Agent, or Firm*—Lee E. Chastain

[57] ABSTRACT

A testable memory array (34) has a plurality of TAG-DATA field pairs. Each TAG asserts a MATCHLINE signal if an input tag matches a stored tag. During normal operation, the asserted matchline signal causes the entry to outputs its DATA field. During a testing mode, testing circuitry (50 and 52) gates the matchline signal with the output of a one-of-N decoder (48). Consequently, only one of the various matchline signals can be asserted at any given time regardless of whether test data creates multiple tag matches. The various TAG bit cells can then be connected in scan chains without risk of driving two different DATA FIELDS to the same output bit line.

11 Claims, 3 Drawing Sheets

5,550,974

TESTABLE MEMORY ARRAY WHICH IS IMMUNE TO MULTIPLE WORDLINE ASSERTIONS DURING SCAN TESTING

FIELD OF THE INVENTION

The present invention generally relates to digital computing systems, and more specifically to testable memory arrays.

BACKGROUND OF THE INVENTION

Device density and circuit functionality are the twin touchstones of the semiconductor industry. The combination of these two criteria are driving the industry to create each new generation of products which are smaller, faster, more functional and less expensive than the prior generation. Unfortunately, these two goals are in opposition to a third, equally important measure, manufacturing testability. No product, however small, fast or functional, can be marketed if the product can not be expected to operate as designed. As products get smaller, faster, and more functional, the number of parameters to be tested increases. And, each parameter becomes more inconvenient to test.

One approach to testing clocked circuits or portions of clocked circuits is by creating scan chains. These circuits may be difficult to test because they are difficult to isolate either functionally or physically from other circuits. A circuit incorporating this method is sometimes referred to as level-sensitive scan design ("LSSD"). In an LSSD circuit, the input 0f each critical latch (a bit cell, the receiver of the output of some block of combinatorial logic, etc.) receives two inputs. The first input is the normal functional data as required by the operation of the latch. The second input is the output from some other latch which is located nearby. A certain number of these critical latches are combined in this way to create a chain. The input to the first latch and the output of the last latch in the chain are connected to the circuit's output pins. During testing, each latch in the LSSD circuit is configured to receive the data output from the nearby latch and particular test data is directly loaded into each of the latches. The circuit is then configured to operate normally and the machine state advanced one or more clock cycles. Finally, the LSSD circuit is configured into the test mode and the data stored in the chains latches is output to verify the proper operation of the data.

The LSSD method results in certain complications which may be worse than they problem they are intended to solve. For instance, pass gate multiplexers require that only one control signal be asserted ("one hot") at a time. Otherwise, the multiplexer will connect two different inputs to the same output node. If the two inputs are different voltage levels, then the multiplexer will cause an electrical short-circuit. Normally, the logic generating the multiplexer's control signals guarantees that only one input signal will ever be asserted, avoiding the electrical short-circuit. However, in an LSSD circuit, it is impossible to guarantee that a certain combination of data will never be input to a particular set of latches during scan in or scan out. Therefore, if the inputs to a pass gate multiplexer are latched and are part of an LSSD chain, then it is impossible to guarantee that the multiplexer will not cause an electrical short-circuit.

SUMMARY OF THE INVENTION

In accordance with the present invention, there is disclosed a testable memory array which substantially eliminates disadvantages of known memory arrays.

A testable memory array has decode means coupled to N entries, where N is an integer. The decode means asserts one and only one of N control signals responsive to a received input signal. Each of the N entries has a tag means, a testing means, and a storage means. The tag means stores a tag and asserts a matchline signal if the tag is logically equivalent to an input tag. The testing means receives the matchline signal, a differing one of the N control signals and a test control signal. The testing means asserts a wordline signal if the test control signal corresponds to a first logic state and the tag means asserts the matchline signal or if the test control signal corresponds to a second logic state and the decode means asserts the differing one of the N control signals. The storage means stores a data field and outputs the data field responsive to the assertion of the wordline signal.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Figure 1:
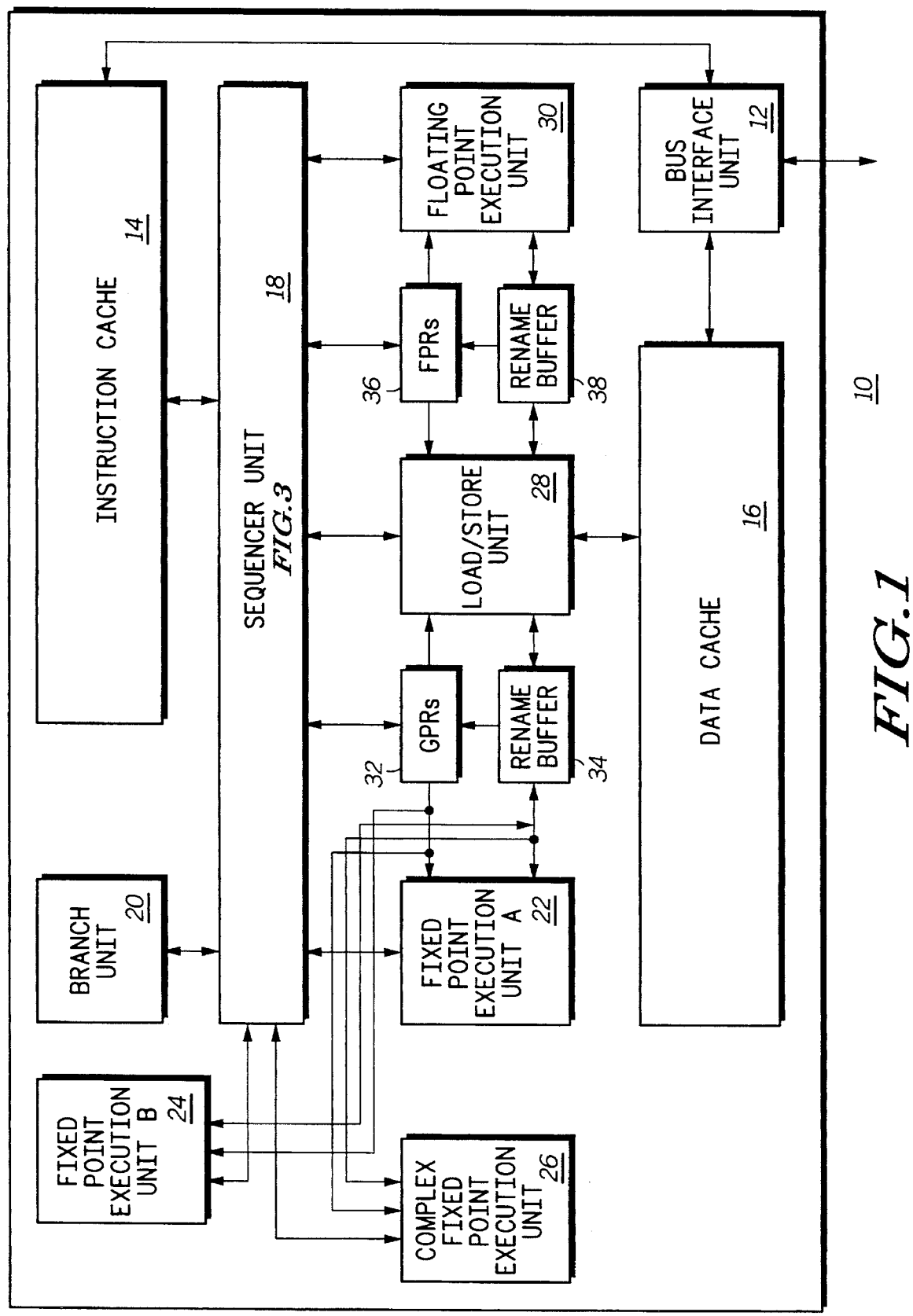
FIG. 1 depicts a block diagram of a data processor constructed in accordance with the present invention.

FIG. 1 depicts a block diagram of a data processor 10 constructed in accordance with the present invention. Data processor 10 is a data processor that improves its manufacturing testability by using level sensitive scan design ("LSSD") circuits in certain areas. For instance, data processor 10 has latch scan chains created from the content addressable memory bit cells ("CAM") and the static random access memory bit cells ("SRAM") of its two rename buffers. Data processor 10 uses two rename buffers to maintain in-order instruction completion in spite of out-of-order instruction completion. These rename buffers forward instruction operands to execution units through pass gate multiplexers. However, the disclosed invention guarantees that these pass gate multiplexers only output one voltage level in both the normal mode and in the test mode. This operation requires minimal additional circuitry.

Continuing with FIG. 1, a bus interface unit (hereafter BIU) 12 controls the flow of data between data processor 10 and the remainder of a data processing system (not depicted). BIU 12 is connected to an instruction cache 14 and to a data cache 16. Instruction cache 14 supplies an instruction stream to a sequencer unit 18. Sequencer unit 18 forwards individual instructions to an appropriate execution unit. Data processor 10 has a branch unit 20, a fixed point execution unit A 22, a fixed point execution unit B 24, a complex fixed point execution unit 26, a load/store execution unit 28, and a floating point execution unit 30. Fixed point execution unit A 22, fixed point execution unit B 24, complex fixed point execution unit 26, and load/store execution unit 28 read and write their results to a general purpose architectural register file 32, (labeled GPRs and hereafter GPR file) and to a first rename buffer 34. First rename buffer 34 is more fully described below in connection with FIGS. 3 and 4. Floating point execution unit 26 and load/store execution unit 28 read and write their results to a floating point architectural register file 36, (labeled FPRs and hereafter FPR file) and to a second rename buffer 38.

The operation of data processor 10 without the disclosed invention is known in the art. In general, branch unit 20 determines what sequence of programmed instructions is appropriate given the contents of certain data registers and the instructions themselves. Instruction cache 14 provides this sequence of programmed instructions to sequencer 18. If instruction cache 14 does not contain the required instructions, then it will fetch them from a main memory system external to data processor 10 (not shown).

Sequencer unit 18 issues the individual instructions of the sequence of programmed instructions to the various execution units 20, 22, 24, 26, 28 and 30. Each of the execution units performs one or more instructions of a particular class of instructions. The particular class of instructions of each execution unit is indicated by the name of the execution unit. For instance, fixed point execution units A and B perform simple mathematical operations on operands expressed in fixed point notation such as addition, subtraction, ANDing, ORing and XORing. Complex fixed point execution 26 performs more complex mathematical operations on operands expressed in fixed point notation such as multiplication and division. Floating point execution unit 30 performs mathematical operations on operands expressed in floating point notation such as multiplication and division.

Fixed point execution units A and B and complex fixed point unit 26 return the results of their operations to designated entries in first rename buffer 34. First rename buffer 34 periodically updates an entry of GPR file 32 with an entry from first rename buffer 34 when all instructions preceding the instruction that generated the result have updated their GPR file entries. Sequencer unit 18 coordinates this updating. Both first rename buffer 34 and GPR file 32 can supply operands to fixed point execution units A and B and to complex fixed point unit 26.

Floating point execution unit 30 returns the results of its operations to designated entries in second rename buffer 38. Second rename buffer 38 periodically updates an entry of FPR file 36 with an entry in second rename buffer 38 when all instructions preceding the instruction that generated the result have updated their FPR file entries. Sequencer unit 18 also coordinates this updating. Both second rename buffer 38 and FPR file 36 supply operands to floating point execution unit 30.

Load/store unit 28 reads data stored in GPR file 32, first rename buffer 34, FPR file 36 or second rename buffer 38 and writes the selected data to data cache 16. This data may also be written to an external memory system (not depicted) depending upon operating characteristics of data processor 10 not relevant to the disclosed invention. Conversely, load/store unit 28 reads data stored in data cache 16 and writes the read data to GPR file 32, first rename buffer 34, FPR file 36 or second rename buffer 38. If data cache 16 does not contain the required data, then it will fetch it from the main memory system external to data processor 10 via BIU 12.

The operation of data processor 10 with the disclosed data cache is described below in connection with FIGS. 2 through 4. In general, data processor 10 is a reduced instruction set computer ("RISC"). Data processor 10 achieves high performance by breaking each instruction into a sequence of smaller steps, each of which may be overlapped in time with steps of other instructions. This performance strategy is known as "pipe lining."

Figure 2:
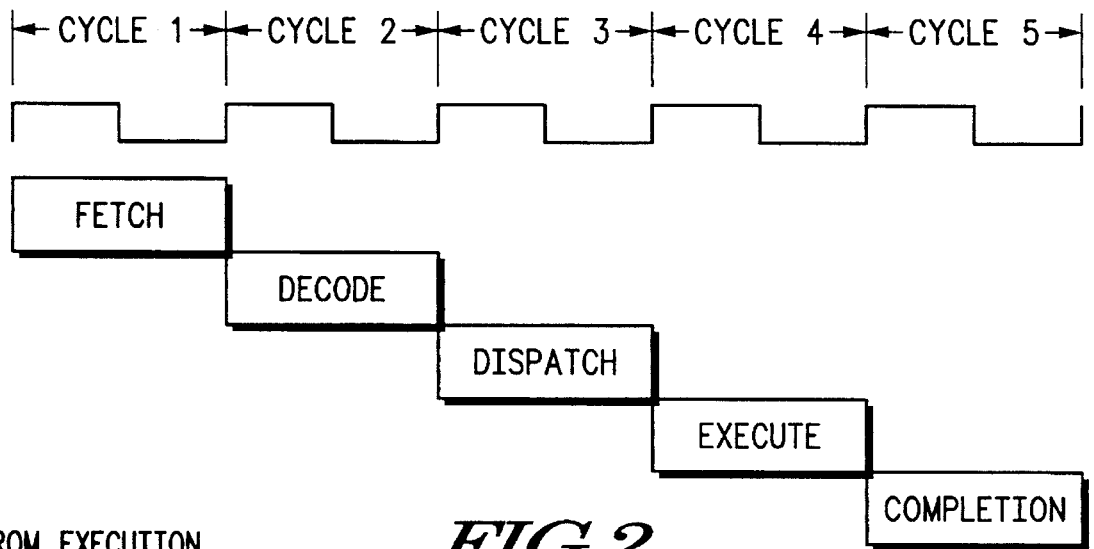
FIG. 2 depicts a timing diagram of an instruction executed by the data processor depicted in FIG. 1.

FIG. 2 depicts a timing diagram of an instruction executed by data processor 10 depicted in FIG. 1. In the depicted embodiment, each instruction is broken into five discrete steps: fetch, decode, dispatch, execute, and completion.

In the fetch stage, memory management circuitry (not shown) within instruction cache 14 retrieves one or more instructions beginning at a memory address identified by sequencer unit 18 or by branch unit 20 in the prior clock cycle.

In the decode stage, instructions are decoded by the sequencer unit 18 into a number of control signals for use by subsequent stages.

In the dispatch stage, sequencer unit 18 routes each instruction to the appropriate execution unit after determining that there are no impermissible data or resource dependencies and after reserving a rename buffer entry for the result of the instruction. The dispatch stage is also responsible for supplying operand information for the instructions being dispatched.

In the execute stage, each particular execution unit executes its programmed instruction. Results, if any, are returned either to first rename buffer 34 or second rename buffer 38, respectively, for integer and floating point results.

In the completion stage, sequencer unit 18 updates the architectural register files with the result of a particular instruction stored in a rename buffer after every instruction preceding the particular instruction has so updated the architectural register file. The completion stage also updates all other architectural states in the machine after every instruction preceding the particular instruction has so updated the architectural state.

Generally, each instruction stage takes one machine clock cycle. However, some instructions, such as complex fixed point instructions, require more than one clock cycle to execute. Therefore, there may be a delay between the execution and completion stages of a particular instruction due to the range of times which previous instructions may have taken to execute.

Figure 3:
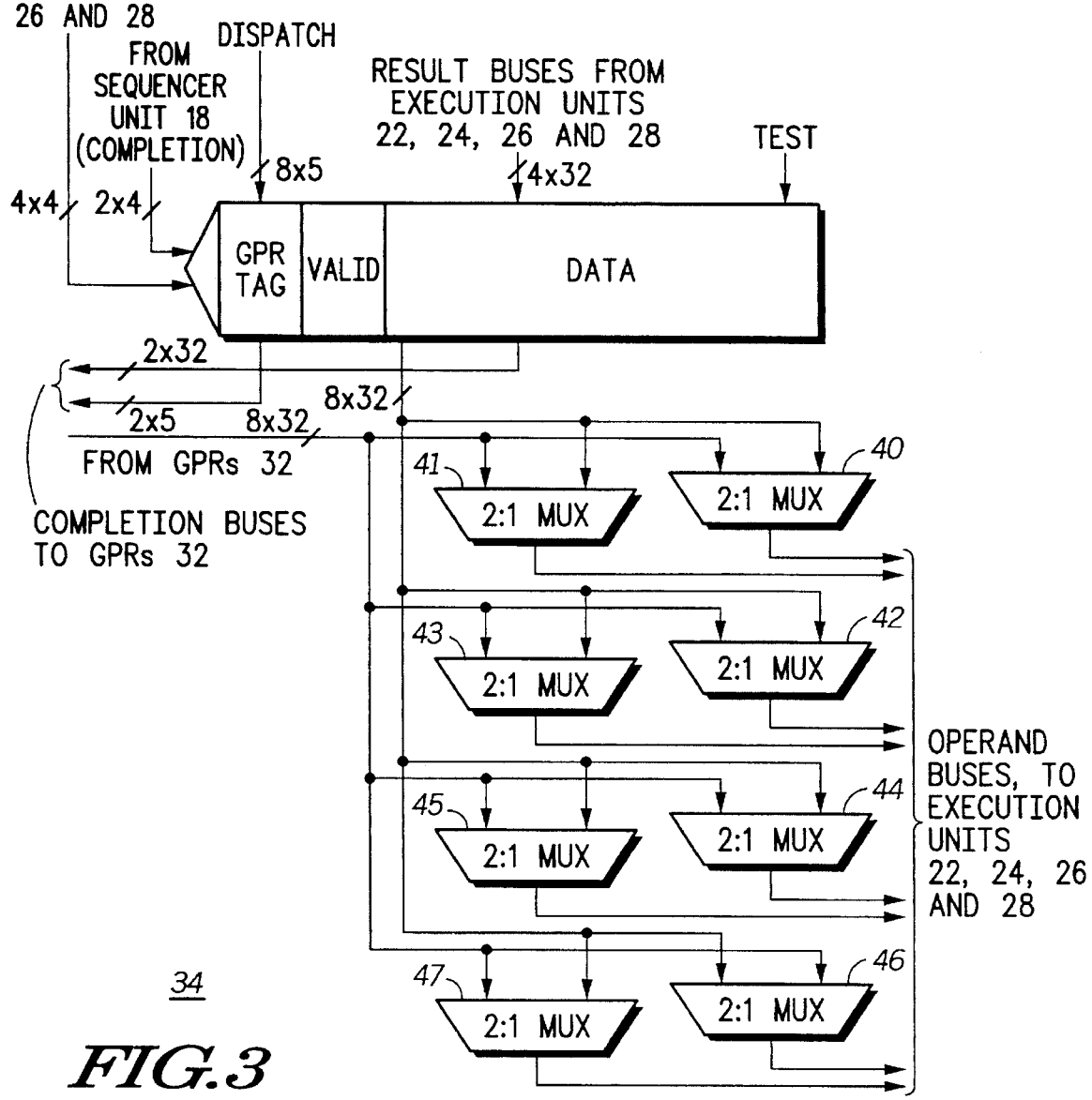
FIG. 3 depicts a block diagram of the first rename buffers depicted in FIG. 1.

FIG. 3 depicts a block diagram of first rename buffer 34 depicted in FIG. 1. First rename buffer 34 contains twelve entries which act as buffers for up to twelve instruction results during the period between each instruction's execution and completion. First rename buffer 34 also receives the control signal TEST. Testing circuitry in data processor 10 (not shown) asserts the control signal TEST when data is scanned into or out of the LSSD chains contained in first rename buffer 34. Rename buffer 34 can be operated normally between scanning in and scanning out data by advancing the processor clock.

First rename buffer 34 is a fully associative cache content addressable memory ("CAM")-static random access memory ("SRAM") structure. Each of the twelve cache lines contains a five bit GPR tag entry stored in a static CAM structure. Each of the twelve cache lines also contains a single valid bit and a thirty-two bit data field stored in an SRAM structure. Sequencer unit 18 copies the data stored in the thirty-two bit data field to the general purpose register file specified by the entry's GPR tag when the instruction generating the data is completed. Each SRAM bit cell in each entries' data field has eight read ports for instruction dispatch, four write ports for instruction write-back (end of instruction execution), and two read ports for instruction completion.

Sequencer unit 18 causes first rename buffer 34 to supply up to eight operands to execution units 22, 24, 26, and 28

(two per execution unit) at instruction dispatch. Sequencer unit 18 applies the necessary number of GPR tags to the eight read ports to forward the operands to eight two-to-one multiplexers 40 through 47. The output of a differing one of the eight two-to-one multiplexers 40 through 47 generates a differing one of eight operand buses. A differing pair of the eight operand buses is connected to a differing one of the execution units 22, 24, 26 and 28. The eight two-to-one multiplexers 40 through 47 also receive eight operands from GPR file 32. GPR file 32 also forwards up to eight operands to the eight multiplexers 40 through 47. Each of the eight multiplexers 40 through 47 outputs the entry sourced by rename buffer 34 if matching the entry matches the input GPR tag field and if it is valid. Otherwise, multiplexers 40 through 47 forward the data stored in GPR file 32 to the execution unit.

Execution units 22, 24, 26 and 28 write back the results of their instructions to first rename buffer 34 via four result buses. Execution units 22, 24, 26 and 28 can execute up to four instructions each machine cycle (one per execution unit). Each one of execution units 22, 24, 26 and 28 applies a four bit index to a different one of the four write ports (four one-of-twelve decoders shown in FIG. 4). Each one of these four one-of-twelve decoders connects the data field of an entry to a particular one of the four write back buses. Sequencer unit 18 supplies these indices to the various execution units when it dispatches the instructions. These indices identify particular entries in first rename buffer 34 to which the execution units write back their instruction results.

Sequencer unit 18 causes first rename buffer 34 to update GPR file 32 at instruction completion. Sequencer unit 18 can complete up to two instructions each machine cycle. Sequencer unit 18 applies two four bit entry indices to two one-of-twelve decoders (FIG. 4). Each one of these two decoders connect the data field of an entry to a particular one of the two completion buses.

Figure 4:
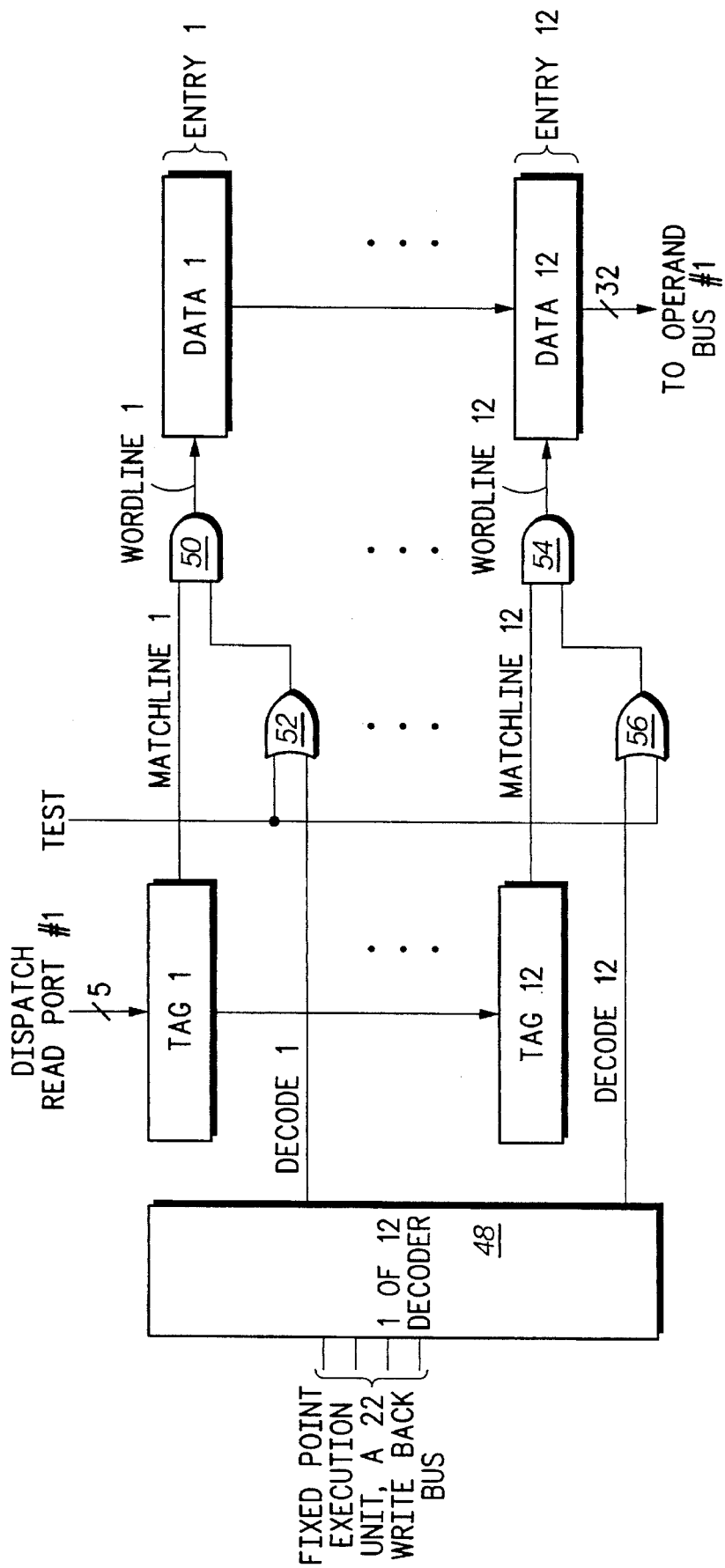
FIG. 4 depicts a simplified block diagram of two entries in the first rename buffer depicted in FIG. 3.

FIG. 4 depicts a simplified block diagram of two entries, ENTRY 1 and ENTRY 12, of rename buffer 34 depicted in FIG. 3. Rename buffer 34 contains ten intervening entries similar to ENTRY 1 and ENTRY 12 as indicated by the intervening ellipsis. As described above, each entry has five multi-ported GPR tag CAM bit cells (collectively labeled TAG 1 and TAG 12), and thirty-two multi-ported DATA SRAM bit cells (collectively labeled DATA 1 and DATA 12). The five GPR tag CAM bit cells receive up to eight GPR tags from sequencer unit 18 on eight sets of bit lines. Similarly, the thirty-two SRAM bit cells output up to eight data fields to multiplexers 40 through 47 on eight sets of bit lines. Only the first set of GPR tag bit lines (labeled "DISPATCH READ PORT #1") and the first set of output bit lines (labeled "TO OPERAND BUS #1") are depicted.

The thirty-two SRAM bit cells in each entry are connected to one set of thirty-two bit lines by a pass gate multiplexer. In particular, the Ith SRAM bit cell in the Jth entry is connected to the Ith bit line via a differing one of three hundred and eighty-four n-type transistors (12×32), where I and J are integer indices ranging from one to thirty-two and from one to twelve, respectively. Each SRAM bit cell has two inverters connected input to output. A first current electrode of the n-type transistor is connected to the output of one of the bit cell inverters of the Ith bit cell. A second current electrode of the n-type transistor is connected to the Ith bit line. A control electrode of the thirty-two n-type transistors connected to the thirty-two SRAM bit cells of the Jth entry are connected to a Jth wordline control signal. When asserted, the Jth wordline places the thirty-two bit cells of the Jth entry into an electrically conductive state. The contents of the thirty-two SRAM bit cells of a particular entry is then output to the thirty-two bit lines.

Normally, sequencer unit 18 prevents rename buffer 34 from ever storing more than one valid instruction result destined for the same general purpose register. This implies that only one or none of the stored GPR tags will ever match an input GPR tag. However, the CAM and SRAM bit cells of rename buffer are interconnected, forming several scan chains for testing purposes. As described above, data can be directly scanned into and out of the chains for purposes of checking functionality. Therefore, it is possible for more than one stored GPR tag to match whatever is input onto the DISPATCH READ PORT #1 during scan in or scan out. If more than one stored GPR tag matches its input, then two data fields will be connected to the same set of bit lines. It is likely that the two data fields of the two matching entries will not be logically equivalent. In this case, rename buffer 34 will connect two different voltage levels to the same bit line, causing permanent damage to rename buffer 34. These two voltage levels correspond to the two different logic states stored in some bit cell of two matching entries. As described below, the disclosed invention prevents this undesirable electrical short-circuit without adding significant additional circuitry.

The Jth wordline is gated with the output of a one-of-twelve decoder 48 during scan in or scan out. This prevents rename buffer 34 from connecting more than one data field entry to the same set of output bit lines. One-of-twelve decoder 48 is already present in rename buffer 34 for write back purposes. An output of an AND gate 50 generates the control signal WORDLINE 1. A first input of AND gate 50 receives a control signal MATCHLINE 1 generated by the first entry's five GPR tag CAM bit cells. A second input of AND gate 50 receives an output of an OR gate 52. A first input of OR gate 52 receives the control signal TEST. A second input of OR gate 52 receives a differing one of the twelve output signals generated by one-of-twelve decoder 48. Similarly, an output of an AND gate 54 generates the control signal WORDLINE 12. A first input of AND gate 54 receives a control signal MATCHLINE 11 generated by the twelfth entry's five GPR tag CAM bit cells. A second input of AND gate 54 receives an output of an OR gate 56. A first input of OR gate 56 receives the control signal TEST. A second input of OR gate 56 receives a differing one of the twelve output signals generated by one-of-twelve decoder 48. It should be understood that each of the seven remaining operand buses is susceptible to testing damage as are the bit lines comprising OPERAND BUS #1. Therefore, these seven other operand buses are also protected as is OPERAND BUS #1.

In normal operation, the control signal TEST is asserted. This assertion forces the output of the twelve OR gates (only OR gates 52 and 56 are depicted) to a high logic state. The twelve AND gates (only AND gates 50 and 54 are depicted) then directly pass the logic states present on the twelve matchline control signals to the twelve wordline control signals. During instruction dispatch, the operation of sequencer unit 18 will guarantee that only one or none of the stored tags will match an input GPR tag. The matching stored GPR tag will assert it matchline signal, connecting the entry's thirty-two SRAM bit cells to the output bit lines. During instruction write back, one-of-twelve decoder 48 connects one and only one entry in rename buffer 34 to a result bus (not shown) connected to fixed point execution unit A 22. This connection facilitates instruction write back.

During testing, it is not important that rename buffer 34 operate as it does normally. In fact, those latches that are members of some scan chain will not receive their normal inputs during testing. However, it is important that rename buffer 34 not be damaged. During testing, the control signal TEST is de-asserted. This de-assertion connects the twelve output signals of one-of-twelve decoder 48 to the inputs of twelve AND gates 50 and 54. The functionality of one-of-twelve decoder 48 ensures that only one of the twelve AND gates 50 through 54 may assert its output. This characteristic of one-of-twelve decoder 48 is independent of its inputs. Therefore, only the one entry receiving the one asserted output of one-of-twelve decoder 48 can connect its data field to the output bit lines. (The one entry may or may not connect its data field to OPERAND BUS #1 depending upon its stored GPR tag and the input GPR tag.)

Although the present invention has been described with reference to a specific embodiment, further modifications and improvements will occur to those skilled in the art. For instance, the disclosed invention may be incorporated into data processors traditionally classified as complex instruction set computers or CISC machines. Also, certain functional units may be omitted in certain embodiments or relocated to other areas of data processor 10. It is to be understood therefore, that the invention encompasses all such modifications that do not depart from the spirit and scope of the invention as defined in the appended claims.

What is claimed is:

1. A testable memory array storing N pairs of stored tags and data fields, each one of the data fields output upon a match of an input tag and the one of the stored tags associated with the one of the data fields, the testable memory array immune to multiple wordline assertions during scan testing, the testable memory array comprising:

a decode means, where N is an integer, the decode means asserting one and only one of N control signals responsive to each one of N possible permutations of a received input signal;

N entries coupled to the decode means, each of the N entries comprising:

tag means storing a stored tag and receiving an input tag, the tag means asserting a matchline signal if the stored tag is logically equivalent to the input tag;

testing means receiving the matchline signal, a differing one of the N control signals and a test control signal, the testing means asserting a wordline signal only if the test control signal corresponds to a first logic state and the tag means asserts the matchline signal or either the test control signal corresponds to a second logic state and the decode means asserts the differing one of the N control signals; and storage means storing a data field, the storage means outputting the data field responsive to an assertion of the wordline signal.

2. The testable memory array of claim 1 wherein the storage means also outputs the data field responsive to the assertion of the differing one of the N control signals.

3. For use in a data processor comprising a rename buffer, the rename buffer storing instruction results during a time period between instruction execution and instruction completion, the rename buffer comprising a testable memory array, the testable memory array storing N pairs of stored tags and instruction results, each one of the instruction results output upon a match of an input tag and the one of the stored tags associated with the one of the instruction results, the testable memory array immune to multiple instruction result outputs during scan testing, the testable memory array comprising:

a decode means, where N is an integer, the decode means asserting one and only one of N control signals responsive to each one of N possible permutations of a received input signal;

N entries coupled to the decode means, each of the N entries comprising:

tag means storing a stored tag and receiving an input tag, the stored tag representative of a register in a data processor, the tag means asserting a matchline signal if the stored tag is logically equivalent to the input tag;

testing means receiving the matchline signal, a differing one of the N control signals and a test control signal, the testing means asserting a wordline signal only if the test control signal corresponds to a first logic state and the tag means asserts the matchline signal or either the test control signal corresponds to a second logic state and the decode means asserts the differing one of the N control signals; and storage means storing an instruction result, the storage means outputting the instruction result responsive to an assertion of the wordline signal.

4. The testable memory array of claim 3 wherein the storage means also outputs the instruction result responsive to the assertion of the differing one of the N control signals.

5. The testable memory array of claim 4 wherein the tag means and the storage means comprises:

a plurality of content addressable memory bit cells; and a plurality of random access memory bit cells, respectively.

6. The testable memory array of claim 5 wherein the testing means comprises:

an OR gate comprising a first input, a second input and an output, the first input receiving the test control signal, the second input receiving the differing one of the N control signals; and an AND gate comprising a first input, a second input and an output, the first input receiving the output of the OR gate, the second input receiving the matchline signal, the output generating the wordline signal.

7. The testable memory array of claim 3 wherein the tag means and the storage means comprises:

a plurality of content addressable memory bit cells; and a plurality of random access memory bit cells, respectively.

8. The testable memory array of claim 7 wherein the testing means comprises:

an OR gate comprising a first input, a second input and an output, the first input receiving the test control signal, the second input receiving the differing one of the N control signals; and an AND gate comprising a first input, a second input and an output, the first input receiving the output of the OR gate, the second input receiving the matchline signal, the output generating the wordline signal.

9. A testable memory array storing N pairs of stored tags and data fields, each one of the data fields output upon a match of an input tag and the one of the stored tags associated with the one of the data fields, the testable memory array immune to multiple wordline assertions during scan testing, the testable memory array comprising:

a one-of-N decoder, where N is an integer, the one-of-N decoder asserting one and only one of N control signals responsive to each one of N possible permutations of a received input signal;

N entries coupled to the one-of-N decoder, each of the N entries comprising:

a plurality of content addressable memory bit cells storing a stored tag and receiving an input tag, the plurality of content addressable memory bit cells asserting a matchline signal if the stored tag is logically equivalent to the input tag;

testing means receiving the matchline signal, a differing one of the N control signals and a test control signal, the testing means asserting a wordline signal only if the test control signal corresponds to a first logic state and the tag means asserts the matchline signal or either the test control signal corresponds to a second logic state and the decode means asserts the differing one of the N control signals; and a plurality of random access memory bit cells storing a data field, the plurality of random access memory bit cells outputting the data field responsive to an assertion of the wordline signal.

10. The testable memory array of claim 9 wherein the plurality of random access memory bit cells also outputs the data field responsive to the assertion of the differing one of the N control signals.

11. The testable memory array of claim 10 wherein the testing means comprises:

an OR gate comprising a first input, a second input and an output, the first input receiving the test control signal, the second input receiving the differing one of the N control signals; and an AND gate comprising a first input, a second input and an output, the first input receiving the output of the OR gate, the second input receiving the matchline signal, the output generating the wordline signal.

* * * * *